(12) United States Patent
Liu et al.

(10) Patent No.: US 8,810,133 B2
(45) Date of Patent: Aug. 19, 2014

(54) GRID FOR ILLUMINATION APPARATUS

(75) Inventors: Yong Liu, Shanghai (CN); Kun-Wah Yip, Shanghai (CN); Di Lou, Shanghai (CN)

(73) Assignee: Koninklijke Philips N.V., Eindhoven (NL)

(*) Notice: Subject to any disclaimer, the term of this patent is extended or adjusted under 35 U.S.C. 154(b) by 181 days.

(21) Appl. No.: 13/379,061

(22) PCT Filed: Jun. 29, 2010

(86) PCT No.: PCT/IB2010/052950
§ 371 (c)(1),
(2), (4) Date: Dec. 19, 2011

(87) PCT Pub. No.: WO2011/001367
PCT Pub. Date: Jan. 6, 2011

(65) Prior Publication Data
US 2012/0098431 A1   Apr. 26, 2012

(30) Foreign Application Priority Data
Jun. 30, 2009   (CN) .......................... 2009 1 0139802

(51) Int. Cl.
*H01J 1/52*   (2006.01)
*F21V 11/02*   (2006.01)

(52) U.S. Cl.
USPC .............................. 315/85; 362/290; 362/293

(58) Field of Classification Search
USPC ............... 315/85; 362/257, 290–293, 296.01, 362/297–300, 307–309
See application file for complete search history.

(56) References Cited

U.S. PATENT DOCUMENTS

| | | | |
|---|---|---|---|
| 3,253,082 A | 5/1966 | Buset | |
| 3,774,024 A | 11/1973 | Deaton | |
| 3,885,150 A * | 5/1975 | Ott | 362/263 |
| 7,204,607 B2 | 4/2007 | Yano et al. | |
| 7,755,263 B2 * | 7/2010 | Park et al. | 313/112 |
| 2008/0094831 A1 * | 4/2008 | Matsumoto | 362/235 |
| 2008/0253129 A1 | 10/2008 | Lin et al. | |

FOREIGN PATENT DOCUMENTS

| | | |
|---|---|---|
| EP | 0638766 A1 | 2/1995 |
| FR | 1364762 A | 6/1964 |
| JP | 546379 | 1/1979 |
| JP | 546380 A | 1/1979 |
| JP | 2002164188 A | 6/2002 |
| JP | 2008192392 A | 8/2008 |

* cited by examiner

*Primary Examiner* — James H Cho
(74) *Attorney, Agent, or Firm* — Yuliya Mathis

(57) ABSTRACT

The invention relates to illumination, especially to a grid for illumination apparatus. This invention provides a grid (100) for attenuating electromagnetic radiation from a light source. The grid comprises a plurality of baffles (110), each baffle being electro conductive, wherein the plurality of baffles are configured to form a plurality of cells (120), each cell being formed as a waveguide so as to attenuate the electromagnetic radiation from the light source. In this way, the electromagnetic radiation from the light source can be reduced or prevented so as to decrease the danger to users.

15 Claims, 4 Drawing Sheets

GRID FOR ILLUMINATION APPARATUS

FIELD OF THE INVENTION

The invention relates to illumination, especially to a grid for illumination apparatus.

BACKGROUND OF THE INVENTION

To overcome 100 Hz light flickering of fluorescent lamps working at 100 Hz alternating current, high-frequency eye care lamps employ a working frequency in the range of 40 kHz to 55 kHz. Inevitably, high-frequency ballasts can lead to electromagnetic radiation. If no action is taken, it is possible that high-frequency electromagnetic radiation is emitted to the outside world. Environmental-protection experts point out that excessive amounts of electromagnetic radiation can lead to palpitation, insomnia, memory degradation, and even reduction of immunity, as well as damage to the heart, the blood circulation system and the neural system. The public has come to the consensus that more protection can reduce the danger from electromagnetic radiation.

U.S. Pat. No. 3,774,024 discloses an illuminator grid adapted to be disposed beneath a source of light to intercept direct light rays travelling at less than a predetermined angle to the horizontal. The illuminator grid comprises a substantially horizontal array of substantially parallel and substantially equally spaced supports, a series of baffles suspending from said supports at substantially equally spaced positions along each support and in interspace positions on adjacent supports, and means connecting each baffle with the corresponding support to permit each baffle to be rotated on the corresponding support to an aligned position and to a position angular to the support, with baffles on alternating supports being oppositely inclined to the baffles on the supports there between. The width of said baffles is less than the center to center spacing of said baffles on the corresponding support and the width of said baffles is greater than the center to center distance between said supports.

The illuminator grid disclosed in U.S. Pat. No. 3,774,024 can only mask the glare of a light source from direct view, but cannot reduce or prevent the electromagnetic radiation from the light source.

SUMMARY OF THE INVENTION

Inventors of the present invention have found that the electromagnetic radiation from a light source may cause danger to the users, especially the users who are very close to the light source; it would therefore be advantageous to reduce or prevent the electromagnetic radiation from the light source.

To better address the above concern, in an embodiment of the present invention, there is provided a grid for attenuating electromagnetic radiation from a light source. The grid comprises:

a plurality of baffles, each baffle being electro conductive, wherein the plurality of baffles are configured to form a plurality of cells, each cell being formed as a waveguide so as to attenuate the electromagnetic radiation from the light source.

The basic idea is to attenuate the electromagnetic radiation from the light source by using the waveguide formed by the electro conductive baffles. Since the waveguide has a cut-off frequency, if the electromagnetic radiation has a frequency below the cut-off frequency, the electromagnetic radiation is attenuated exponentially when it travels along the waveguide. Therefore, by rationally designing the waveguide formed by the cells, the electromagnetic radiation from the light source can be effectively attenuated, and then the electromagnetic radiation from the light source is reduced or prevented to decrease the danger to users. At the same time, the grid has a certain depth which can narrow the radiation angle of the light from the light source to reduce the glare caused by direct light emission into users' eyes.

It is known that the energy of the electromagnetic wave decreases more as it travels longer along a waveguide if the frequency of the electromagnetic wave is lower than the cut-off frequency of the waveguide. In an embodiment of the present invention, for a cell having different cross-sectional shapes and a preset electromagnetic radiation attenuation value, the depth of the cell can be determined to have the electromagnetic radiation from the light source attenuated with the preset electromagnetic radiation attenuation value.

In another embodiment of the present invention, there is provided a luminaire. The luminaire comprises a light source and a grid as described above, wherein the light source is placed at one side of the grid.

By placing the grid at one side of the light source, which can reduce or prevent the electromagnetic radiation from the light source, the electromagnetic radiation is reduced at the other side of the grid as a result of passing through the grid, and less danger is caused to the users of the luminaire. In addition, the radiation angle of the light passing through the grid becomes narrow and then glare caused by direct light emission into users' eyes is reduced.

These and other aspects of the invention will be apparent from and elucidated with reference to the embodiments described hereinafter.

DESCRIPTION OF THE DRAWINGS

The above and other objects and features of the present invention will become more apparent from the following detailed description considered in connection with the accompanying drawings, in which.

The same reference numerals are used to denote similar parts throughout the Figures.

DETAILED DESCRIPTION

Firstly, there is provided a grid 100 for attenuating electromagnetic radiation from a light source.

Figure 1A:
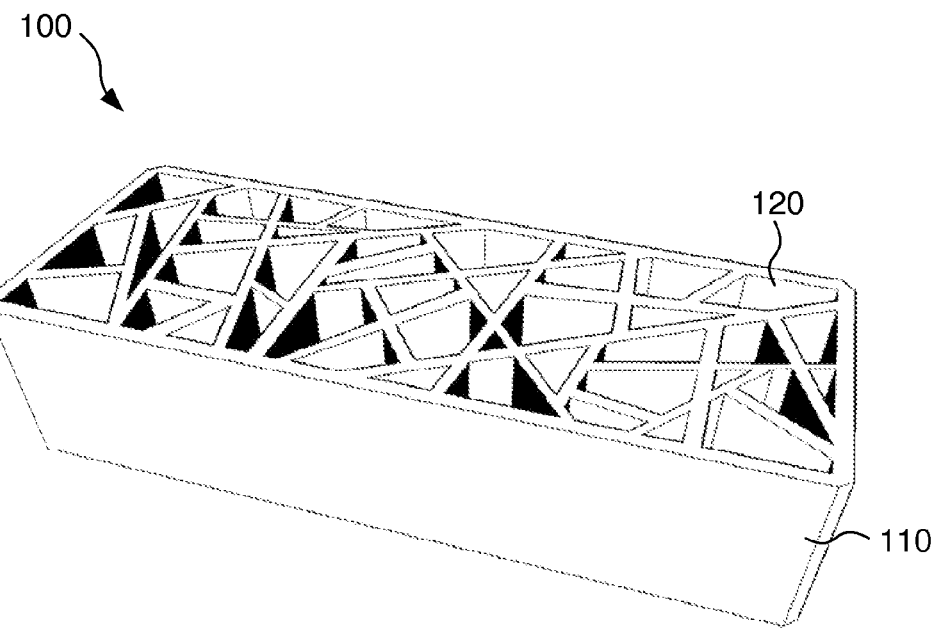
FIG. 1 (a) to FIG. 1 (c) depict schematic diagrams of embodiments of the grid.
Figure 1B:
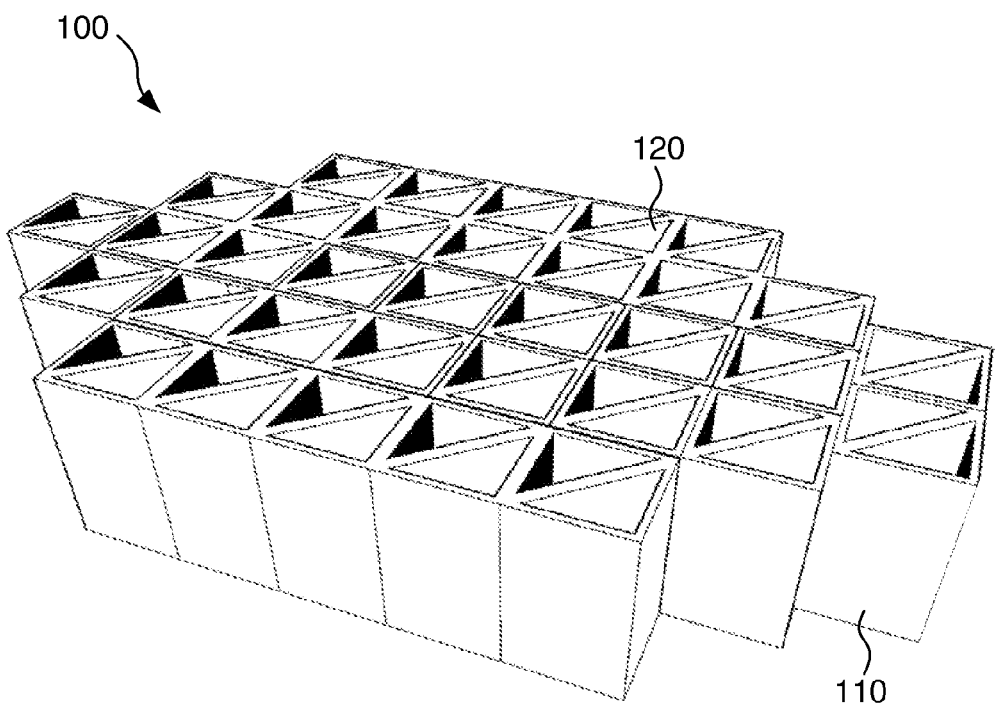
Figure 1C:
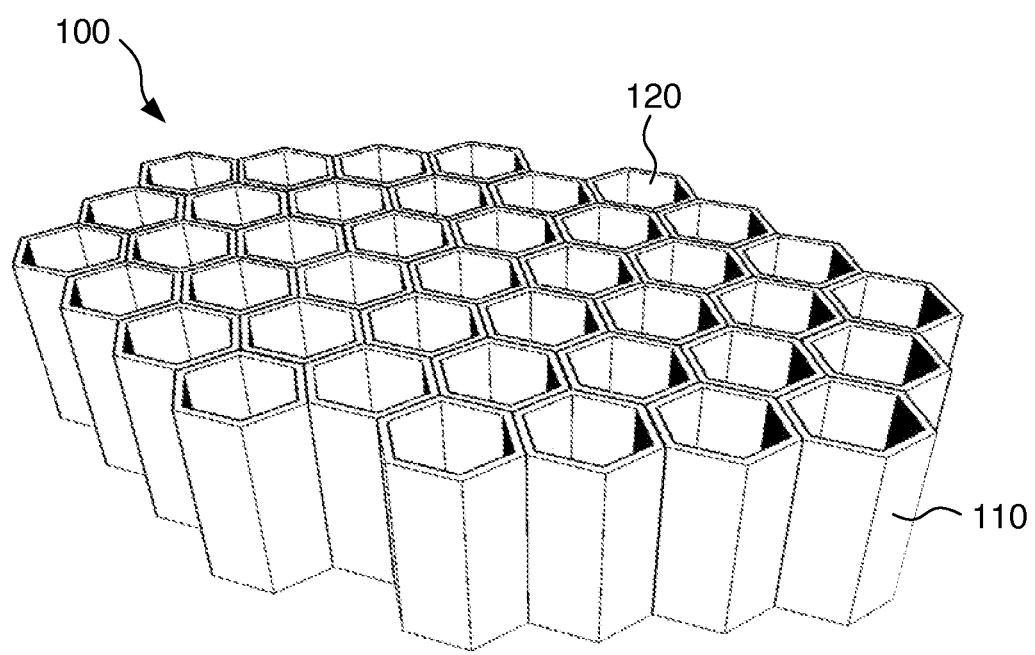
Figure 2A:
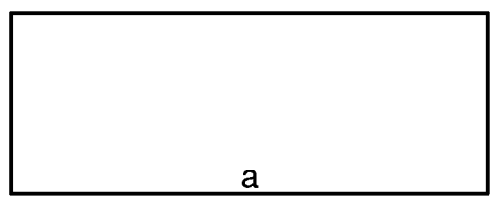
FIG. 2 (a) to FIG. 2 (e) depict schematic diagrams of embodiments of cross-sectional shapes of the cell.
Figure 2B:
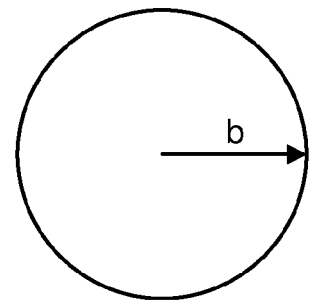
Figure 2C:
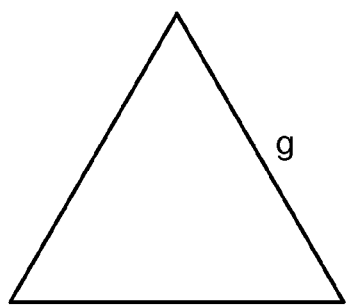
Figure 2D:
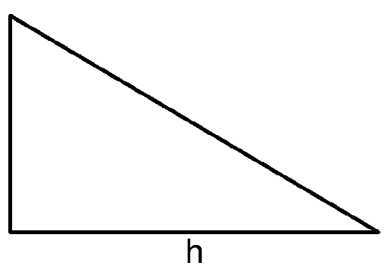
Figure 2E:
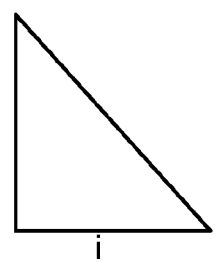

FIG. 1 (a) to FIG. 1 (c) depict schematic diagrams of embodiments of the grid.

The grid comprises a plurality of baffles 110, each baffle 110 being electro conductive.

The electro conductive baffle 110 can be made in many ways, for example, by using an electro conductive material, such as copper, aluminum and iron, or covering the baffle 110 with an electro conductive material. The thickness of the electro conductive material covering the baffle 110 can be determined by using the following equation:

$$\delta = \sqrt{\frac{2\rho}{\omega\mu}},$$

wherein δ is the skin depth, i.e., the minimum thickness of the electro conductive material covering the baffle 110, ω is the angular frequency of the electromagnetic wave to be attenuated, and μ is the absolute permeability of the electro conductive material.

Referring to FIG. 1 (*a*) to FIG. 1 (*c*), the plurality of baffles 110 are configured to form a plurality of cells 120, each cell 120 being formed as a waveguide so as to attenuate the electromagnetic radiation from the light source. Since the baffles 110 are electro conductive, the cell 120 formed by the electro conductive baffles 110 becomes a waveguide. The waveguide has a cut-off frequency, and the electromagnetic radiation having a frequency lower than the cut-off frequency is attenuated exponentially when it travels along the waveguide. Therefore, by rationally designing the waveguide formed by the cells, the electromagnetic radiation from the light source can be effectively attenuated.

The cell 120 can have different cross-sectional shapes, such as a circle, a rectangle, a triangle, etc. In addition, the plurality of cells 120 can have the same cross-sectional shape or different cross-sectional shapes, and the plurality of cells 120 can have the same cross-sectional size or different cross-sectional sizes. As shown in FIG. 1 (*a*), the plurality of cells 120 have different cross-sectional shapes including triangles, quadrangles and pentagons, and the cells 120 having the same cross-sectional shape have different cross-sectional sizes. As shown in FIG. 1 (*b*), the plurality of cells 120 have the same cross-sectional shape which is an isosceles right-angle triangle and the plurality of cells 120 have different cross-sectional sizes. As shown in FIG. 1 (*c*), the plurality of cells 120 have the same cross-sectional shape of a hexagon and the plurality of cells 120 have different cross-sectional sizes.

The plurality of cells 120 can have substantially the same depths as shown in FIG. 1 (*a*) to FIG. 1 (*c*), or at least two cells 120 among the plurality of cells 120 have different cross-sectional shapes and/or depths.

In an embodiment of the plurality of cells 120, the plurality of cells 120 comprise a cell 120 having a cut-off frequency higher than an effective frequency of the electromagnetic radiation from the light source.

The light source (not shown) can comprise many kinds of illuminating components, such as fluorescent lamps, light emitting diodes, halogen lamps, incandescent lamps or organic light-emitting materials, etc. The light source can comprise one or several kinds of illuminating components. When the light source comprises only one kind of illuminating component, the electromagnetic radiation of the fundamental wave and the higher harmonics generated by the illuminating components covers a certain frequency spectrum. Taking a compact energy-saving fluorescent lamp as an example, it can generate electromagnetic radiation in the range of 50 kHz to 250 kHz: 50 kHz is the frequency at which the energy of the fundamental wave generated by the compact energy-saving fluorescent lamp is the highest; and 100 kHz, 150 kHz, 200 kHz and 250 kHz are the frequencies at which the energy of the higher harmonics generated by the compact energy-saving fluorescent lamp is the highest. The maximal energy of the electromagnetic radiation generated by the compact energy-saving fluorescent lamp decreases from the fundamental wave to the higher harmonics. When the light source comprises several kinds of illuminating components, the electromagnetic radiation generated by the light source covers a larger frequency spectrum.

The effective frequency can be any frequency in the frequency spectrum of the electromagnetic radiation from the light source. The effective frequency can be determined in many ways. For example, the effective frequency can be determined based on the frequency at which the energy of the fundamental wave generated by the light source is the highest, or based on the frequency at which the energy of a higher harmonic generated by the light source is the highest. The effective frequency can also be determined based on a predefined energy threshold of the electromagnetic radiation: determining a frequency range by comparing the electromagnetic radiation energy of the light source with the predefined energy threshold, and then determining the effective frequency. For example, when a predefined energy threshold of the electromagnetic radiation is −70 dBm and the energy of the electromagnetic radiation from the light source is higher than −70 dBm, if the frequency is lower than 150 kHz, then the effective frequency is determined as 150 kHz.

The cut-off frequency of the cell 120 can be a little higher than the effective frequency of the electromagnetic radiation from the light source, or much higher than the effective frequency, such as fifty times the effective frequency. When the effective frequency is fixed, the higher the cut-off frequency of the cell 120, the better the attenuation effect on the electromagnetic radiation and the shallower the depth of the cell.

FIG. 2 (*a*) to FIG. 2 (*c*) depict schematic diagrams of embodiments of cross-sectional shapes of the cell.

The size of the cross-section of the cell 120 can be determined based on the cut-off frequency and a predefined cross-sectional shape of the cell 120.

When the predefined cross-sectional shape of the cell 120 is a rectangle as shown in FIG. 2 (*a*), the size of the cross-section of the cell 120 is determined by using the following equation: $a=c/(f_c \times 2)$, wherein a is the length of the long side of the cell 120, $f_c$ is the cut-off frequency of the cell 120, and c is the velocity of light.

When the predefined cross-sectional shape of the cell 120 is a circle as shown in FIG. 2 (*b*), the size of the cross-section of the cell 120 is determined by using the following equation: $b=(m \times c)/(f_c \times 2 \times \pi)$, wherein b is the radius of the cell 120, m is the first pole of the first kind of Bessel function of the first order (such as 1.84), $f_c$ is the cut-off frequency of the cell 120, and c is the velocity of light.

When the predefined cross-sectional shape of the cell 120 is an equilateral triangle as shown in FIG. 2 (*c*), the size of the cross-section of the cell 120 is determined by using the following equation: $g=(2 \times c)/(f_c \times 3)$, wherein g is the length of a side of the cell 120, $f_c$ is the cut-off frequency of the cell 120, and c is the velocity of light.

When the predefined cross-sectional shape of the cell 120 is a right-angle triangle with angles of π/2, π/3 and π/6 as shown in FIG. 2 (*d*), the size of the cross-section of the cell 120 is determined by using the following equation: $h=c/(f_c \times \sqrt{3})$, wherein h is the length of the side opposite to the angle of π/3 of the cell 120, $f_c$ is the cut-off frequency of the cell 120, and c is the velocity of light.

When the predefined cross-sectional shape of the cell 120 is a right-angle triangle with angles of π/2, π/4 and π/4 as shown in FIG. 2 (*e*), the size of the cross-section of the cell 120 is determined by using the following equation: $i=c/(f_c \times 2)$, wherein i is the length of the side opposite to an angle of π/4 of the cell 120, $f_c$ is the cut-off frequency of the cell 120, and c is the velocity of light.

When the predefined cross-sectional shape of the cell is regular or irregular, the size of the cross-section of the cell 120 can also be determined by using simulation software, such as HFSS (High Frequency Structure Simulation) or CST-MWS (Computer Simulation Technology Microwave Studio). The cross-sectional shape of the cell can be determined by using simulation software via the following steps: determining the constraint condition of the cross-sectional size; performing the local optimum search of the cross-sectional size of the cell based on the input predefined cross-sectional shape, cut-off frequency and the constraint condition of the cross-sectional size; and determining the cross-sectional shape of the cell.

When the cross-sectional shape of the cell is fixed, the size of the cross-section of the cell can be changed by adjusting the cut-off frequency of the cell, or the cut-off frequency can be changed by adjusting the size of the cross-section of the cell.

Figure 3:
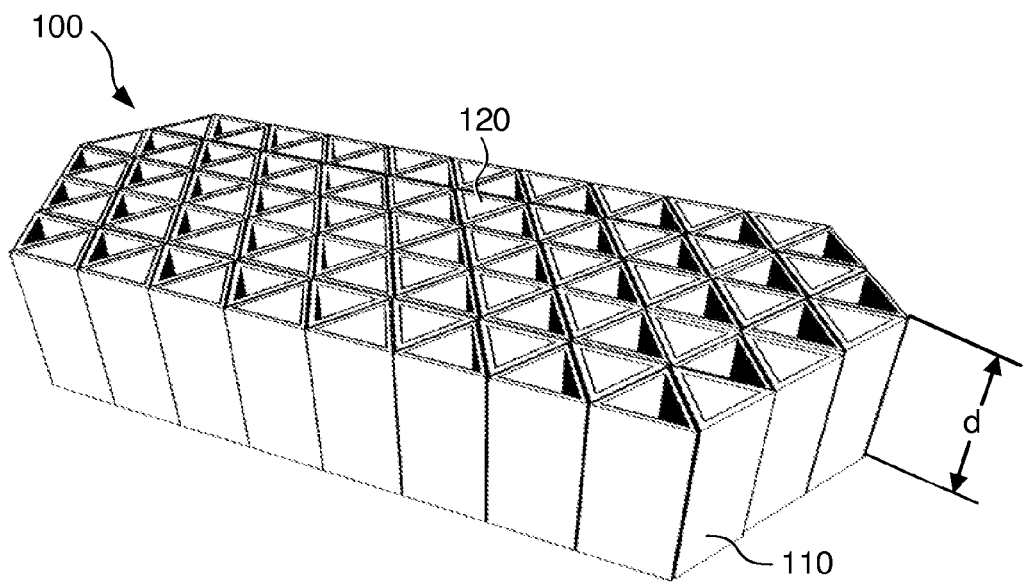
FIG. 3 depicts a schematic diagram of an embodiment of the grid.

FIG. 3 depicts a schematic diagram of an embodiment of the grid.

When the cut-off frequency of the cell 120 is fixed, the depth of the cell can be determined by using the following equation:

$$d \geq (L \times c) \Big/ \left( 40 \times \pi \times \log_{10}^{e} \times f \times \sqrt{\left(\frac{f_c}{f}\right)^2 - 1} \right),$$

wherein d is the depth of the cell 120, $f_c$ is the cut-off frequency of the cell 120, f is the effective frequency of the electromagnetic radiation from the light source, L is a preset electromagnetic radiation attenuation value of the cell 120, c is the velocity of light, and e is the Napierian base.

When the cut-off frequency of the cell is much higher than the effective frequency of the electromagnetic radiation from the light source, the depth of the cell can be determined by using the following equation: $d \geq (L \times c)/(40 \times \pi \times \log_{10}^{e} \times f_c)$, wherein d is the depth of the cell 120, $f_c$ is the cut-off frequency of the cell 120, L is a preset electromagnetic radiation attenuation value of the cell 120, c is the velocity of light, and e is the Napierian base.

The preset electromagnetic radiation attenuation value can be determined in many ways, such as, for example, by setting the background noise at a frequency as an attenuation target and then determining the preset electromagnetic radiation attenuation value at the frequency. Electromagnetic radiation energy of modern light sources is usually below −50 dBm, and basic wave frequencies of modern light sources are in the range of 40~200 kHz. If the tenth harmonic is taken into consideration, electromagnetic radiation frequencies of modern light are in the range of 20 k~2 MHz. In the bandwidth of 10 kHz, the background noise is about −61 dBm at 200 kHz, the background noise is about −72 dBm at 500 kHz, the background noise is about −80 dBm at 1 MHz, and the background noise is about −89 dBm at 2 MHz. For the electromagnetic radiation energy of −50 dBm, the preset electromagnetic radiation attenuation value is about −10 dB at 200 kHz, the preset electromagnetic radiation attenuation value is about −20 dB at 500 kHz, the preset electromagnetic radiation attenuation value is about −30 dB at 1 MHz, and the preset electromagnetic radiation attenuation value is about −40 dB at 2 MHz. According to the above analysis, in one embodiment, the preset electromagnetic radiation attenuation value is in the range of [20 dB, 40 dB] to attenuate the high frequency electromagnetic radiation with the grid 110.

When the preset electromagnetic radiation attenuation value and the cut-off frequency of the cell 120 is determined, the depth of the cell 120 can be determined based on the above equations.

In addition, because the relationship between the cut-off frequency of the cell 120 and the cross-sectional size of the cell 120 can be determined, the depth of the cell 120 can be determined according to the cross-sectional size of the cell 120.

As shown in FIG. 3, the cross-sectional shape of the cell 120 is an equilateral triangle; based on the above equations, when the cut-off frequency is much higher than the effective frequency of the electromagnetic radiation from the light source and the preset electromagnetic radiation attenuation value is 40 dB, the depth d of the cell 120 is about the same as the length of one side of the equilateral triangle cross-section of the cell 120.

If the cross-sectional shape of the cell is a rectangle, based on the above equations, when the cut-off frequency is much higher than the effective frequency of the electromagnetic radiation from the light source and the preset electromagnetic radiation attenuation value is 40 dB, the depth of the cell is about 1.5 times the length of the long side of the rectangle cross-section of the cell. If the cross-sectional shape of the cell is a circle, based on the above equations, when the cut-off frequency is much higher than the effective frequency of the electromagnetic radiation from the light source and the preset electromagnetic radiation attenuation value is 40 dB, the depth of the cell is about 2.5 times the length of the radius of the circle cross-section of the cell.

The depth of each cell can be determined by applying the above methods, or the minimum depth value of each cell can be calculated first by applying the above methods and then the maximum value among the calculated minimum depth values is set as the minimum depth for all the cells.

The cross-sectional shape and the size (including the cross-sectional size and depth) of the plurality of cells can also be determined by taking some other requirements into consideration, such as the requirement of reducing the glare of the light source in direct view or requirements regarding the appearance of the grid.

Figure 4:
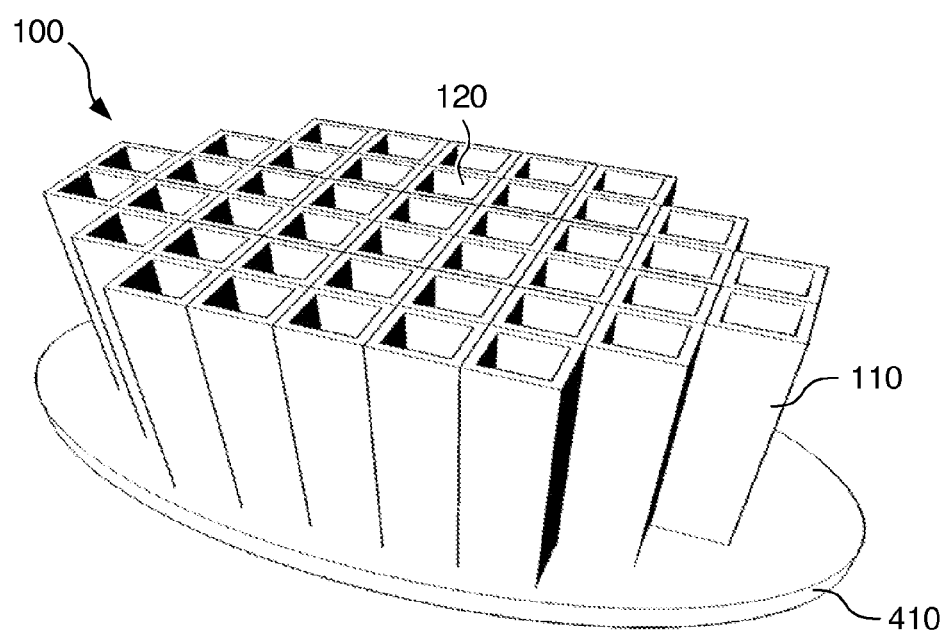
FIG. 4 depicts a schematic diagram of an embodiment of the luminaire.

FIG. 4 depicts a schematic diagram of an embodiment of the luminaire.

In another embodiment of the present invention, there is provided a luminaire. The luminaire comprises a light source and a grid 100 as described above, wherein the light source is placed at one side of the grid 100.

Referring to FIG. 4, the light source (not shown) is placed in a lampshade 410, and the grid 100 is placed at one side of the light source. Since the grid 100 can attenuate the electromagnetic radiation from the light source, the electromagnetic radiation is reduced at the other side of the grid 100 by passing through the grid 100 and less danger is caused to the users during operation of the luminaire. In addition, the grid 100 can also reduce the glare of the light source in direct view, so the glare impact on the users can be reduced.

The lampshade 410 can be implemented in many ways. When the lampshade 410 is made of electro conductive material with no slit, the electromagnetic radiation from the light source cannot leak to the outside world. The lampshade 410 can also be implemented with the grid 100.

It should be noted that the above-mentioned embodiments illustrate rather than limit the invention and that those skilled in the art will be able to design alternative embodiments without departing from the scope of the appended claims. In the claims, any reference signs placed between parentheses shall not be construed as limiting the claim. The word "comprising" does not exclude the presence of elements or steps not listed in a claim or in the description. The word "a" or "an" preceding an element does not exclude the presence of a plurality of such elements.

The invention claimed is:

1. A grid for attenuating electromagnetic radiation from a light source, comprising:
a plurality of baffles, each baffle being electro conductive,
wherein the plurality of baffles are configured to form a plurality of cells, each cell being formed as a waveguide so as to attenuate the electromagnetic radiation from the light source, wherein the plurality of cells comprises at least one cell having a cut-off frequency higher than an effective frequency of the electromagnetic radiation from the light source, wherein the cell comprises a depth, and wherein the depth of the cell is a function of the cut-off frequency of the cell and a preset electromagnetic radiation attenuation value of the cell.

2. The grid as claimed in claim 1, wherein a size of the cross-section of the cell is determined based on the cut-off frequency and a predefined cross-sectional shape of the cell.

3. The grid as claimed in claim 2, wherein the size of the cross-section of the cell is determined by using the following equation when the predefined cross-sectional shape of the cell is a rectangle:

$$a=c/(f_c\times 2),$$

wherein
a is the length of the long side of the cell,
$f_c$ is the cut-off frequency of the cell, and
c is the velocity of light.

4. The grid as claimed in claim 2, wherein the size of the cross-section of the cell is determined by using the following equation when the predefined cross-sectional shape of the cell is a circle:

$$b=(m\times c)/(f_c\times 2\times \pi),$$

wherein
b is the radius of the cell,
m is the first pole of the first kind of Bessel function of the first order,
$f_c$ is the cut-off frequency of the cell, and
c is the velocity of light.

5. The grid as claimed in claim 2, wherein the size of the cross-section of the cell is determined by using the following equation when the predefined cross-sectional shape of the cell is an equilateral triangle:

$$g=(2\times c)/(f_c\times 3),$$

wherein
g is the length of a side of the cell,
$f_c$ is the cut-off frequency of the cell,
c is the velocity of light.

6. The grid as claimed in claim 2, wherein the size of the cross-section of the cell is determined by using the following equation when the predefined cross-sectional shape of the cell is a right-angle triangle with angles of $\pi/2$, $\pi/3$ and $\pi/6$:

$$h=c/(f_c\times \sqrt{3}),$$

wherein
h is the length of the side opposite to the angle of $\pi/3$ of the cell,
$f_c$ is the cut-off frequency of the cell, and
c is the velocity of light.

7. The grid as claimed in claim 2, wherein the size of the cross-section of the cell is determined by using the following equation when the predefined cross-sectional shape of the cell is a right-angle triangle with angles of $\pi/2$, $\pi/4$ and $\pi/4$:

$$i=c/(f_c\times 2),$$

wherein
i is the length of the side opposite to an angle of $\pi/4$ of the cell,
$f_c$ is the cut-off frequency of the cell, and
c is the velocity of light.

8. The grid as claimed in claim 2, wherein a depth of the cell is determined by using the following equation:

$$d\geq (L\times c)/(40\times \pi \times \log_{10}e\times f_c),$$

wherein
d is the depth of the cell,
$f_c$ is the cut-off frequency of the cell,
L is a preset electromagnetic radiation attenuation value of the cell,
c is the velocity of light, and
e is the Napierian base.

9. The grid as claimed in claim 8, wherein the preset electromagnetic radiation attenuation value of the cell is in the range of [10 dB, 40 dB].

10. The grid as claimed in claim 1, wherein the plurality of cells have substantially the same depths.

11. The grid as claimed in claim 1, wherein at least two cells among the plurality of cells have different cross-sectional shapes.

12. A luminaire, comprising:
a light source; and
a grid as claimed in claim 1;
wherein the light source is placed at one side of the grid.

13. The grid as claimed in claim 1, wherein at least two cells among the plurality of cells have different depths.

14. A grid for attenuating electromagnetic radiation from a light source, comprising:
a plurality of baffles, each baffle being electro conductive,
wherein the plurality of baffles are configured to form a plurality of cells, each cell being formed as a waveguide so as to attenuate the electromagnetic radiation from the light source, wherein the plurality of cells comprises at least one cell having a cut-off frequency higher than an effective frequency of the electromagnetic radiation from the light source, wherein a size of the cross-section of the cell is determined based on the cut-off frequency and a predefined cross-sectional shape of the cell, wherein
if the predefined cross-sectional shape of the cell is a rectangle, the size of the cross-section of the cell is determined using $a=c/(f_c\times 2)$, wherein a is the length of the long side of the cell, $f_c$ is the cut-off frequency of the cell, and c is the velocity of light,
if the predefined cross-sectional shape of the cell is a circle, the size of the cross-section of the cell is determined using $b=(m\times c)/(f_c\times 2\times \pi)$, wherein b is the radius of the cell, m is the first pole of the first kind of Bessel function of the first order, $f_c$ is the cut-off frequency of the cell, and c is the velocity of light,
if the predefined cross-sectional shape of the cell is an equilateral triangle, the size of the cross-section of the cell is determined using $g=(2\times c)/(f_c\times 3)$, wherein g is the length of a side of the cell, $f_c$ is the cut-off frequency of the cell, and c is the velocity of light,
if the predefined cross-sectional shape of the cell is a right-angle triangle with angles of $\pi/2$, $\pi/3$ and $\pi/6$, the size of the cross-section of the cell is determined using $h=c/(f_c\times \sqrt{3})$, wherein h is the length of the side opposite to the angle of $\pi/3$ of the cell, $f_c$ is the cut-off frequency of the cell, and c is the velocity of light, and
if the predefined cross-sectional shape of the cell is a right-angle triangle with angles of $\pi/2$, $\pi/4$ and $\pi/4$, the size of the cross-section of the cell is determined using $i=c/(f_c\times$ 2), wherein i is the length of the side opposite to an angle of π/4 of the cell, $f_c$ is the cut-off frequency of the cell, and c is the velocity of light.

15. A grid for attenuating electromagnetic radiation from a light source, comprising:

a plurality of baffles, each baffle being electro conductive, wherein the plurality of baffles are configured to form a plurality of cells, each cell being formed as a waveguide so as to attenuate the electromagnetic radiation from the light source, wherein the plurality of cells comprises at least one cell having a cut-off frequency higher than an effective frequency of the electromagnetic radiation from the light source, wherein a size of the cross-section of the cell is determined based on the cut-off frequency and a predefined cross-sectional shape of the cell, wherein a depth of the cell is determined by using the following equation: $d \geq (L \times c)/(40 \times \pi \times \log_{10}^{e} \times f_c)$, wherein d is the depth of the cell, $f_c$ is the cut-off frequency of the cell, L is a preset electromagnetic radiation attenuation value of the cell, c is the velocity of light, and e is the Napierian base.

\* \* \* \* \*